United States Patent
Alfke

(10) Patent No.: US 7,574,635 B1
(45) Date of Patent: Aug. 11, 2009

(54) CIRCUIT FOR AND METHOD OF TESTING A MEMORY DEVICE

(75) Inventor: Peter H. Alfke, Los Altos Hills, CA (US)

(73) Assignee: XILINX, Inc., San Jose, CA (US)

( * ) Notice: Subject to any disclaimer, the term of this patent is extended or adjusted under 35 U.S.C. 154(b) by 950 days.

(21) Appl. No.: 11/021,686

(22) Filed: Dec. 23, 2004

(51) Int. Cl.
*G11C 29/00* (2006.01)

(52) U.S. Cl. .................. 714/719; 710/52; 713/400; 714/731; 714/744

(58) Field of Classification Search ............ 710/52; 714/731, 744, 735, 750, 824, 719; 365/189.011; 375/225, 226, 244
See application file for complete search history.

(56) References Cited

U.S. PATENT DOCUMENTS

| | | | |
|---|---|---|---|
| 5,471,583 A * | 11/1995 | Au et al. | 710/57 |
| 5,481,549 A * | 1/1996 | Tokuyama | 714/744 |
| 5,953,372 A * | 9/1999 | Virzi | 375/224 |
| 6,366,530 B1 * | 4/2002 | Sluiter et al. | 365/240 |
| 6,385,236 B1 * | 5/2002 | Chen | 375/224 |
| 6,788,109 B2 * | 9/2004 | Kitagawa | 326/93 |
| 6,949,955 B2 * | 9/2005 | Glasser | 326/93 |
| 7,161,999 B2 * | 1/2007 | Parikh | 375/354 |
| 2003/0185325 A1 * | 10/2003 | Wahl | 375/362 |

OTHER PUBLICATIONS

U.S. Appl. No. 10/838,957, filed May 4, 2004, Lowe et al.

* cited by examiner

*Primary Examiner*—Henry W. H. Tsai
*Assistant Examiner*—Elias Mamo
(74) *Attorney, Agent, or Firm*—John J. King

(57) ABSTRACT

Circuit and methods for testing a memory device are disclosed. According to one aspect of the invention, a circuit for testing an asynchronous data transfer comprises a first circuit receiving a stream of data in response to a clock signal in a first clock domain. A second circuit coupled to the first circuit receives the stream of data from the first circuit in response to a low level of an empty signal in the second clock domain. A comparator circuit coupled to receives the stream of data and the output of the second circuit. Specific applications to dual port RAMs as well as implementations in a programmable logic devices are disclosed. Various methods of testing an asynchronous data transfer are also disclosed.

22 Claims, 4 Drawing Sheets

CIRCUIT FOR AND METHOD OF TESTING A MEMORY DEVICE

FIELD OF THE INVENTION

The present invention relates generally to memory devices, and in particular, to a circuit for and method of testing a memory device.

BACKGROUND OF THE INVENTION

Memory devices are important components of many integrated circuits or products having integrated circuits. Because memories are so significant to the operation of these devices, it is important that data stored in a memory device can be correctly accessed. Data can be written to a memory and read from a memory using a single clock signal. Such memories enable synchronous data transfers. Data could also be asynchronously transferred in memory devices which receive data and output data using two separate asynchronous clocks. Asynchronous clocks not only have a different phase, but also have a different frequency.

Memory devices also have various protocols for outputting stored data. For example, a first-in first-out (FIFO) memory is a memory device where a data sequence is written to and retrieved from the memory in exactly the same order. No explicit addressing is required, and the write and read operations can be completely independent and use unrelated clocks. While the concept of a FIFO is simple, the implementation of an asynchronous FIFO is often difficult. One common implementation of an asynchronous FIFO is a random access memory (RAM) having two independently clocked ports (i.e. one for writing and one for reading), and two independent address counters to steer write and read data. However, synchronizing and decoding the two ports operating at two asynchronous frequencies can require significant engineering effort.

In particular, asynchronous FIFOs commonly include signals indicating the extreme conditions of the FIFO, such as empty or full. Even experienced designers have had problems decoding these two conditions in a fail-safe way. Synchronization is difficult when the FIFOs operate with two independent clocks of several hundred megahertz (MHz). When the last data entry is being read, an EMPTY signal goes active (e.g. goes "high") after a read clock reads the final data. The read enable signal must then be inactive until the EMPTY signal has gone inactive or "low" again.

Unlike a synchronous FIFO where both the rising and the falling edge of the EMPTY signal are synchronous with the common clock, the rising and falling edges of an EMPTY signal of an asynchronous FIFO are not synchronous with a single clock. That is, the EMPTY signal can only be caused by a read operation, and therefore the leading edge is naturally synchronous with the read clock. However, the trailing edge is caused by a write operation, and therefore is synchronous with the write clock. According, it is necessary to move the trailing edge of the EMPTY signal to the read clock domain. A variety of techniques for moving the trailing edge to the read clock domain could be used, including the common technique of using synchronizing flip-flops. However, such techniques might create metastability.

Considerable design effort is spent and additional circuitry is used to manipulate the trailing edge of the EMPTY signal so that it is moved to the read clock domain. However, testing a FIFO for reliable operation requires determining that the clock synchronization circuit for the two clock signals, which can have an infinite number of timing relationships, will successfully transfer the trailing edge of the EMPTY signal to the read clock domain. On the other hand, a manufacturer wants to test the FIFO thoroughly, but in a limited time, such as a few seconds.

Accordingly, there is a need for a circuit and method of testing a memory device to ensure that a circuit for moving a clock signal to a different clock domain is functioning properly.

SUMMARY OF THE INVENTION

According to one aspect of the invention, a circuit for testing an asynchronous data transfer in a memory device comprises a first circuit receiving a stream of data in response to a clock signal in a first clock domain. A second circuit coupled to the first circuit receives the stream of data from the first circuit in response to a faster clock in the second clock domain and receives the stream of data until the first circuit generates an empty signal. A comparator circuit is coupled to receive the stream of data and the output of the second circuit. Specific applications for dual port RAMs as well as implementations in programmable logic devices are disclosed.

One embodiment includes a method of testing an asynchronous data transfer. The method comprises steps of coupling a stream of data to a first circuit in response to a first clock signal in a first clock domain. The stream of data is output in response to a second clock signal in a second clock domain. Data from the first circuit is written to the second circuit in response to the low level of the EMPTY signal in the second clock domain. Finally, data output by the second circuit is compared to the stream of incoming data.

DETAILED DESCRIPTION OF THE DRAWINGS

In one exemplary embodiment of the present invention the purpose is to test a FIFO with asynchronous read and write clocks, i.e., whether the synchronization of the trailing edge of empty (which naturally is caused by a write clock) into the read clock domain is reliable. For this purpose, a first FIFO is connected in series with a second FIFO. An ascending counter sequence is written into the first FIFO by a write clock. This sequence is read out of the first FIFO and written into a second FIFO by a read clock (for the first FIFO, which is the write clock for the second FIFO. Thus the terms read clock and write clock are for illustrative purposes only). The sequence is sequentially read out of the second FIFO by the same clock that is writing into the first FIFO, i.e., the write clock. With the read clock slightly faster than the write clock, the first FIFO will typically go EMPTY after each write cycle and the second FIFO will ideally never go empty. A constant difference between the input into the first FIFO and the output of the second FIFO means that the system is operating properly.

The FIFOs that are being tested, e.g., the first FIFO and that are used for the testing, e.g., the second FIFO, are in one embodiment part of an FPGA. While illustrative examples of FPGAs and the test circuits as described in FIGS. 4 and 5 may be implemented in an FPGA in some embodiments, other embodiments include hardwired FIFOs as application specific circuits implemented on one or more integrated circuits which may or may not have programmable logic.

Figure 1:
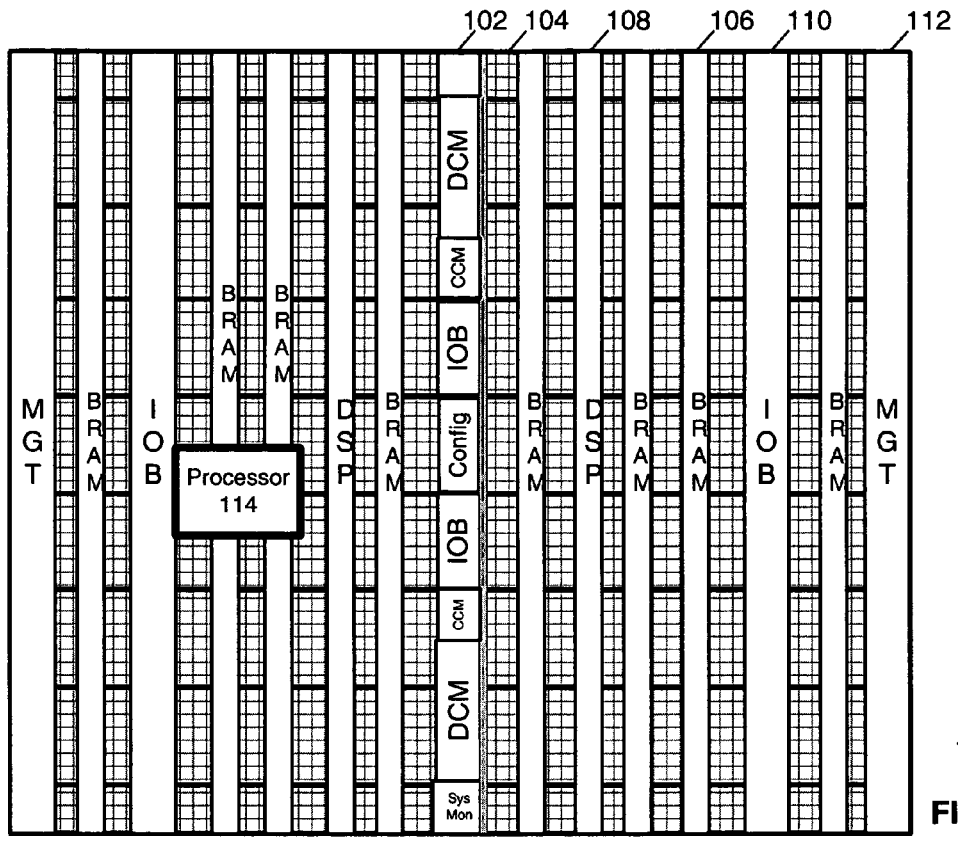
FIG. 1 is a block diagram of an example of a programmable logic device for implementing the circuits and methods according to an embodiment the present invention.

Turning first to FIG. 1, a block diagram of a programmable logic device for implementing the circuits and methods of the present invention is shown. In particular, the circuitry of the FPGA 100 is laid out across the surface of a die as a plurality of columns of repeatable tiles. Although the majority of columns have substantially homogeneous circuits, a heterogeneous center column 102 has a variety of different circuits. For example, the circuit elements in column 102 may include a system performance monitor (SYSMON) circuit, a digital clock manager (DCM) circuit, a clock companion module (CCM) circuit, and configuration logic (CONFIG). The system performance monitor may include an analog-to-digital converter (ADC) to monitor parameters such as temperature and voltage both on-chip and off-chip. The DCM may include circuits to perform clock de-skew, clock phase shifting, clock frequency synthesis, and other clock features. The CCM may include circuits for phase-matched binary clock division and internal clock jitter & skew measurement. The configuration logic includes logic needed to address and load the configuration memory cells of the SRAM-based FPGA during configuration of the FPGA. The configuration logic in this example also may include configuration registers, boundary scan test circuitry such as JTAG circuitry, and encryption and/or decryption circuitry used to encrypt and/or decrypt bitstreams of configuration data loaded into and read out of the FPGA.

Each homogeneous column preferably has substantially identical circuit elements substantially filling the column. The substantially identical circuit elements in a column are of a particular circuit type from a group of circuit types that may include a Configurable Logic Block (CLB) type 304, a Block Random Access Memory (BRAM) type 306, a Digital Signal Processor (DSP) type 308, an Input/Output Block (IOB) type 310, and a Multi-Giga Bit Transceiver (MGT) type 312. The various elements of the programmable logic circuit of FIG. 1 are used to implement the various circuits described in FIGS. 2-6. Similarly, the BRAM is preferably used to store the configuration data for configuring the programmable logic device as will be described in more detail below. Finally, the FPGA 100 may comprise an embedded processor 114. The programmable logic device could be, for example, one of the Virtex family of field programmable gate arrays available from Xilinx, Inc. of San Jose, Calif.

Figure 2:
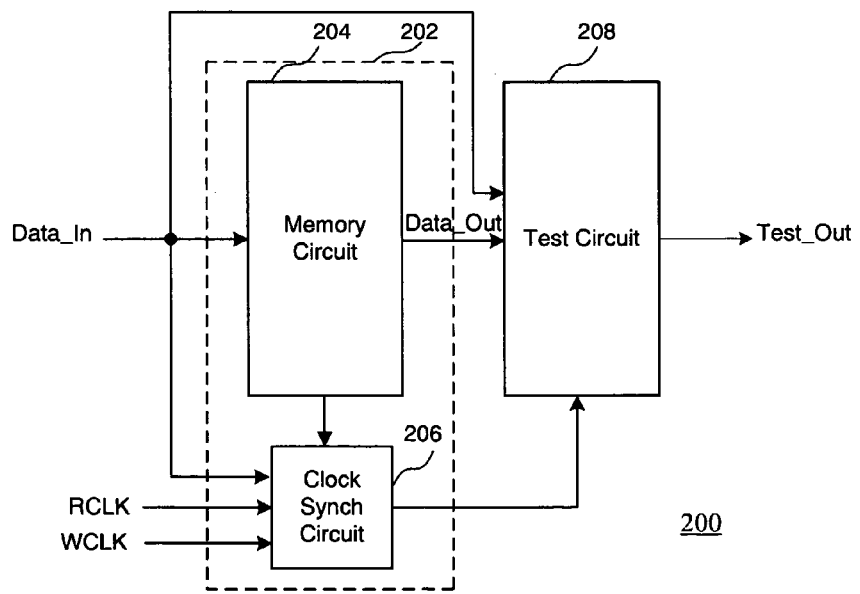
FIG. 2 is a block diagram of a circuit for testing a memory device according to an embodiment the present invention.

Turning now to FIG. 2, a block diagram of a circuit for testing a memory device according to an embodiment the present invention is shown. A test circuit 200 comprises a memory device 202 having a memory circuit 204 and a clock synchronization circuit 206. Memory circuit 204 receives an input Data_In, and generates an output signal, Data_Out. A test circuit 208 is coupled to receive data output by the memory circuit 204 and synchronization signals from the clock synchronization circuit 206. The test circuit 208 receives the input data, the output of the memory circuit 204, and an output from the clock synchronization circuit. The test circuit 208 generates an output Test_Out, which indicates whether the clock synchronization circuit is functioning properly, as will be described in more detail below.

Figure 3:
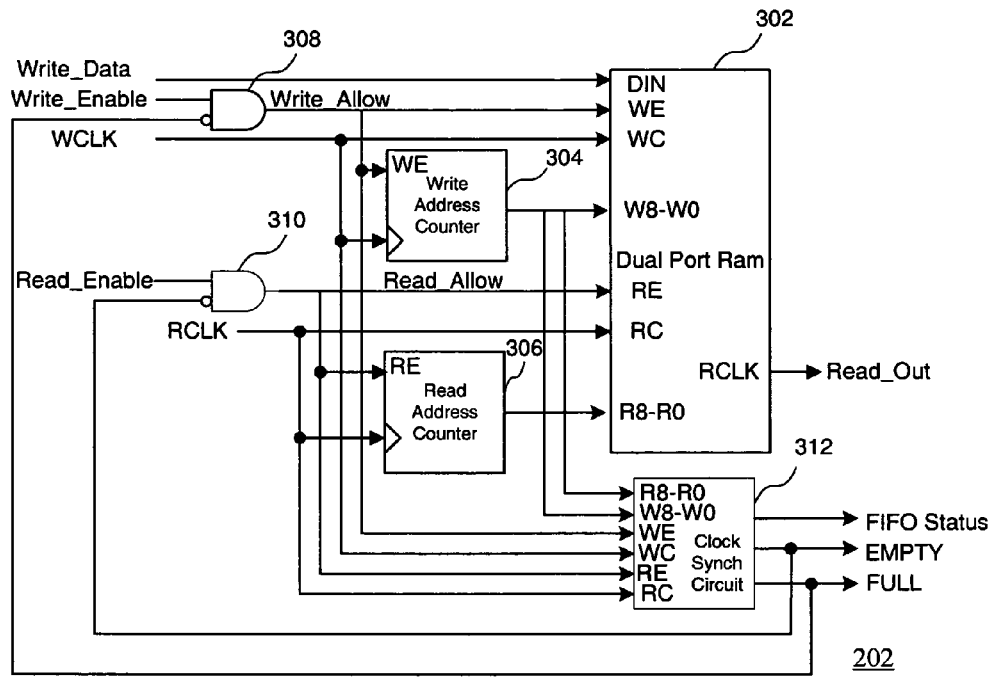
FIG. 3 is a block diagram of a memory device according to an embodiment of the present invention.

Turning now to FIG. 3, a block diagram of a memory device 202 according to an embodiment of the present invention is shown. In particular, memory device 202 comprises a dual-port RAM 302 having a write address counter 304 and a read address counter 306. A pair of AND gates 308 and 310, which receive write and read enable signals, respectively, as well as EMPTY and FULL signals generated by a clock synchronization circuit 312, generate a WRITE_ALLOW signal and a READ_ALLOW signal. The dual port RAM is controlled by the WRITE_ALLOW signal applied to its write enable (WE) terminal, a write clock (WCLK) signal applied to its write clock (WC) terminal, the READ_ALLOW signal applied to its read enable (RE) terminal, and a read clock (RCLK) signal applied to its read clock (RC) terminal. In addition, memory device 302 receives a binary write address W8-W0 from write address counter 304, and a binary read address R8-R0 from read address counter 306.

During write operations, the WRITE_ALLOW signal is generated by the first AND gate 308 in response to an externally generated WRITE_ENABLE input signal and an inverted FULL control signal generated by the clock synchronization circuit 312. Memory device 302 stores a WRITE_DATA value applied at its data in (DIN) port in a memory location identified by binary write address W8-W0 when the WRITE_ALLOW signal is asserted (i.e., when the WRITE_ENABLE signal is high and the FULL control signal is low). In contrast, data signals received at the DIN port of memory device 302 are ignored when the WRITE_ALLOW signal is not asserted (i.e., when either the FULL control signal is high or the WRITE_ENABLE signal is de-asserted).

Similarly, during read operations, the READ_ALLOW signal is generated by a second AND gate 310 in response to an externally generated READ_ENABLE input signal and an inverted EMPTY control signal, where the EMPTY control signal is also generated by the clock synchronization circuit 312. Memory device 302 transmits a word from the memory location identified by binary read address R8-R0 through its data output (DOUT) port when the READ_ALLOW signal is asserted (i.e., when the READ_ENABLE signal is high and the EMPTY control signal is low). In contrast, the binary read address R8-R0 is ignored by memory 101 when the READ_ALLOW signal is not asserted (i.e., when either the EMPTY control signal is high or the READ_ENABLE signal is low).

The clock synchronization circuit 312 generates the FULL and EMPTY control signals, which are well know in the art. The clock synchronization circuit generates an EMPTY signal having a trailing edge which is moved from the write clock domain to the read clock domain. Circuits for enabling moving the trailing edge of the EMPTY signal from the write clock domain to the read clock domain can be found in U.S. patent application Ser. No. 10/838,957, entitled "First-In, First-Out Buffer System in an Integrated Circuit," by Wayson J. Lowe, et. al., filed May 4, 2004, the entire application of which is incorporated by reference herein. However, it should be understood that the choice of clock synchronization circuits is immaterial, and that one significant advantage of the present invention is that the circuits and methods disclosed could be used with any clock synchronization circuit to determine whether the clock synchronization circuit is functioning properly.

The memory device in FIG. 3, can be part of one or more BRAM circuits 106 shown in FIG. 1 in one embodiment of the present invention.

Figure 4:
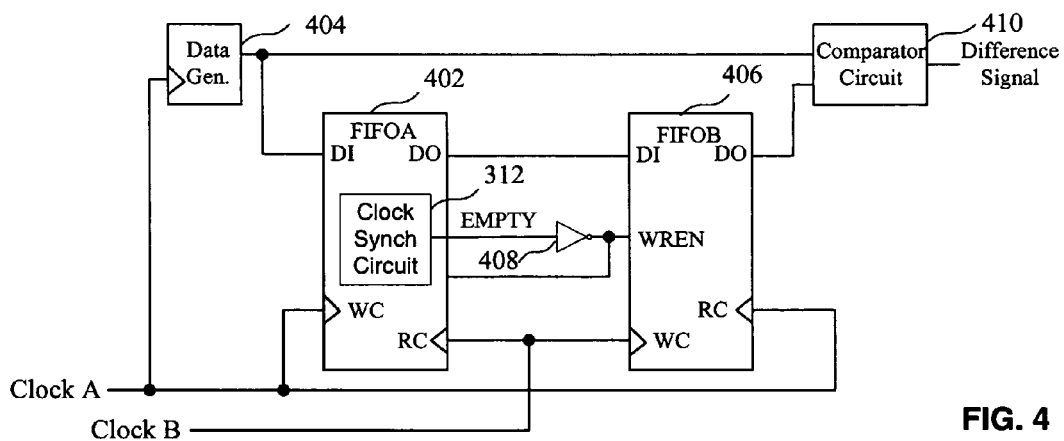
FIG. 4 is a block diagram of a test circuit for testing a clock synchronization circuit according to an embodiment of the present invention.

Turning now to FIG. 4, a block diagram of a test circuit for testing a clock synchronization circuit according to an embodiment of the present invention is shown. According to the embodiment of FIG. 4, a pair of FIFOs is coupled between a data generator and a comparator circuit. Each FIFO is preferably a dual port FIFO, which writes data into a first port of the FIFO, and reads data from a second port of the FIFO. In particular, a first FIFO 402 (FIFOA) is coupled to receive data at an input from a data generator 404. The data is then provided as output data DO and coupled to a second FIFO 406 (FIFOB). According to one aspect of the invention, separate write and read clock signals comprising periodic pulses are coupled to the write and read ports, as will be described in more detail below. Also, an EMPTY signal is coupled from FIFOA to the FIFOB to indicate whether FIFOA is empty, as is well known in the art. When FIFOA is empty, an active EMPTY signal is generated. The EMPTY signal has a leading edge generated in the read clock domain and a trailing edge also in the read clock domain after being inherently generated in the write clock domain and then converted into the read domain.

In operating the test circuit of FIG. 4, a Clock A is coupled to the data generator 404, which outputs data to FIFOA and the comparator 410. The data generator 404 could be, for example a binary counter. By employing a counter, a difference signal is easily generated by the comparator circuit 410. Clock A is also coupled to a write enable input of FIFOA and a read enable input of FIFOB. A second clock, Clock B, is an asynchronous clock used to read FIFOA, and write into FIFOB. The EMPTY signal is coupled to an inverter 408, the output of which is coupled to the write enable input of FIFOB. Accordingly, when EMPTY goes low (i.e. indicating that data is available from FIFOA), the output of the inverter 408 will go high, indicating that data from FIFOA can be written to FIFOB.

Because Clock B (read clock) is asynchronous with Clock A (write clock) and runs at a faster clock rate than Clock A, FIFOA will usually go empty during any read cycle. For example, the write port continuously writes the content of a counter into the FIFOA, thus storing data as a count in sequence at 100 MHz. The read side operates at a slightly higher frequency, for example approximately 110 MHz. The second frequency is preferably not exactly 110 MHz to avoid any coherence between the two clocks. The write operation will proceed undisturbed, but the slightly faster read operation will force the FIFO to go empty on almost every read cycle. The next write cycle will cause the FIFO to go NOT EMPTY, but this signal is being moved over to the read domain. The trailing edge of the EMPTY signal will have a statistically random position within the 10 ns write cycle, for example. With 100 million operations per second for a 10 ns write cycle, the circuit of an embodiment of the present invention will cover, each second, 100 million different phases between the clocks that each fit somewhere into a 10 ns window. That is, the timing granularity is 10 ns divided by 100 million, or 0.1 femtosecond. Accordingly, the circuits and methods of the present invention automatically cover many possible random timing relationships with a granularity that is impossible to achieve in a traditional deterministic way. That is, there is no way to adjust any clock with 0.1 femtoseconds granularity. An electrical signal, which typically propagates on a PC-board or inside an IC at half the speed of light, travels 150 nm in 0.1 femtosecond. The shortest time interval which can be generated inside the chip is about 20 picoseconds, which is 200,000 times longer than 0.1 fs. Accordingly, the circuit of the present invention provides a relatively simple circuit which is both fast and highly accurate.

Figure 5:
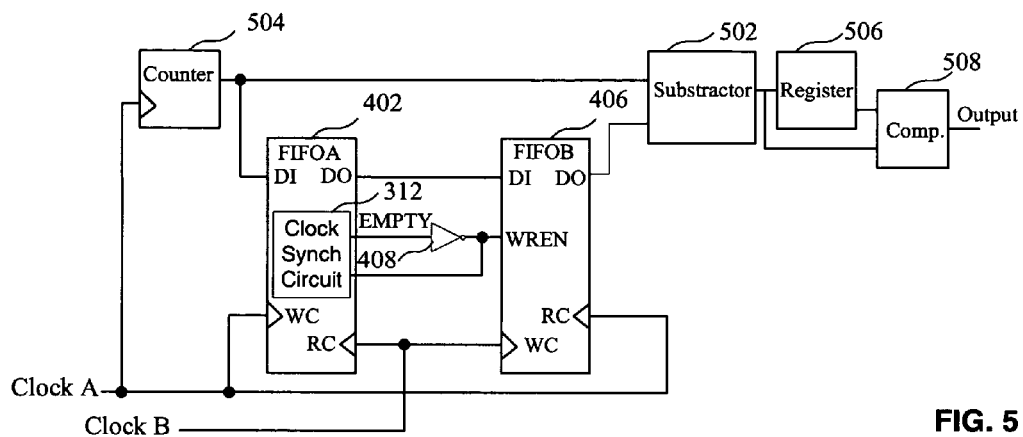
FIG. 5 is a block diagram of a test circuit for testing a clock synchronization circuit according to an alternate embodiment of the present invention.

Turning now to FIG. 5, a block diagram of a test circuit for testing a clock synchronization circuit according to an alternate embodiment of the present invention is shown. According to the embodiment of FIG. 5, rather than generating a difference signal, a subtractor 502 is coupled to receive the output of a counter 504. The subtractor 502 generates a difference between an ascending sequence of data written into FIFOA 402 and the same data read from FIFOB 406. The output of the subtractor is stored in a register 506, and coupled to a comparator 508. The comparator 508 checks whether the output of the subtractor is constant over a time period, for example, the previous and present read clock cycles. If the output of the comparator is on average zero over time (i.e., the output of the subtractor is constant over time) then the EMPTY in FIFOA is working properly and the test is passed.

Figure 6:
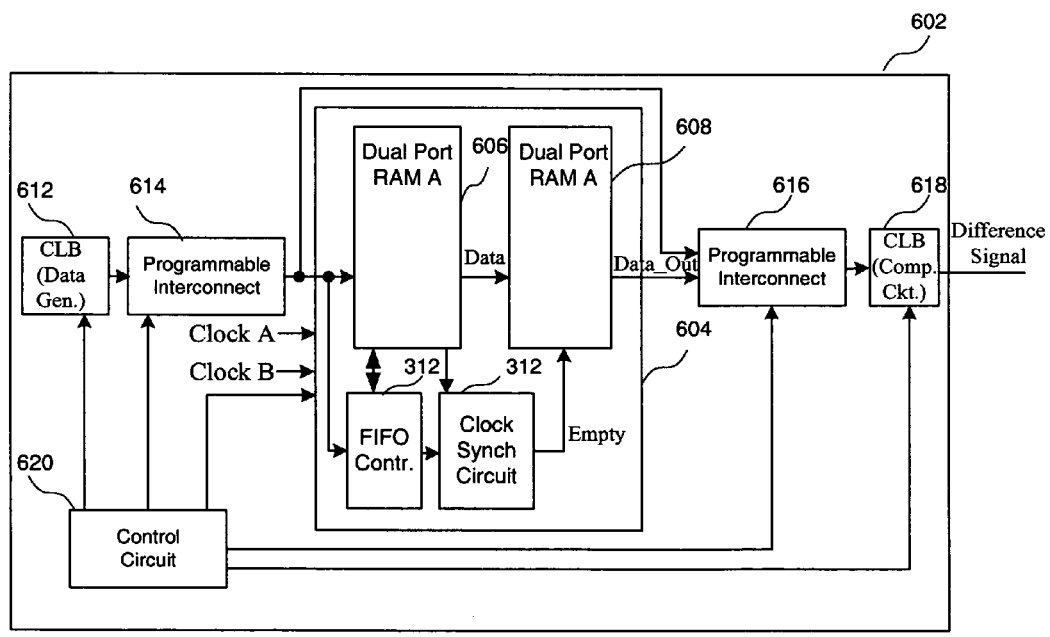
FIG. 6 is a block diagram of a programmable logic device configured to test a clock synchronization circuit according to an embodiment of the present invention.

Turning now to FIG. 6, a block diagram of a programmable logic device configured to test a clock synchronization circuit according to an embodiment of the present invention is shown. In particular, the present invention could be employed in a programmable logic device 602, such as a field programmable logic device (FPGA) or a complex programmable logic device (CPLD). The programmable logic device 602 comprises a block RAM (BRAM) 604 having a first dual port RAM 606 and a second dual port RAM 608. Clock A and Clock B are routed to the ports of the dual port RAM, as described above with respect to FIG. 4, and an EMPTY signal is generated by a clock synchronization circuit 312. A configurable logic block 612 comprising configurable logic circuits is coupled to a programmable interconnect block 614. The programmable interconnect block 614 comprises a plurality of conductors for routing signals between other circuits of the programmable logic device, such as between the CLB 612 and the BRAM 604. Similarly, a second programmable interconnect block 616 enables communication between the BRAM 604 and a configurable logic block 618 which is configured as a comparator circuit, as described for example in FIGS. 4 and 5.

Although CLB 612 and 618 are shown as separate circuits, the functions of the circuits could be implemented in a single configurable logic block. Similarly, the transfer signals between the elements of FIG. 6 could be enabled by a single programmable interconnect block. Finally, a control circuit 620 is preferably coupled to control the various components of FIG. 6. Although the control circuit of FIG. 6 is shown incorporated in configurable logic block 602, the control circuit could be separate. Similarly, the functions of the data generator and comparator circuits could be implemented in a dedicated control circuit 622 with the BRAM. Finally, although particular circuits of a configurable logic device are shown in FIG. 6, the circuit of FIG. 6 could employ any of the elements of FIG. 1.

Figure 7:
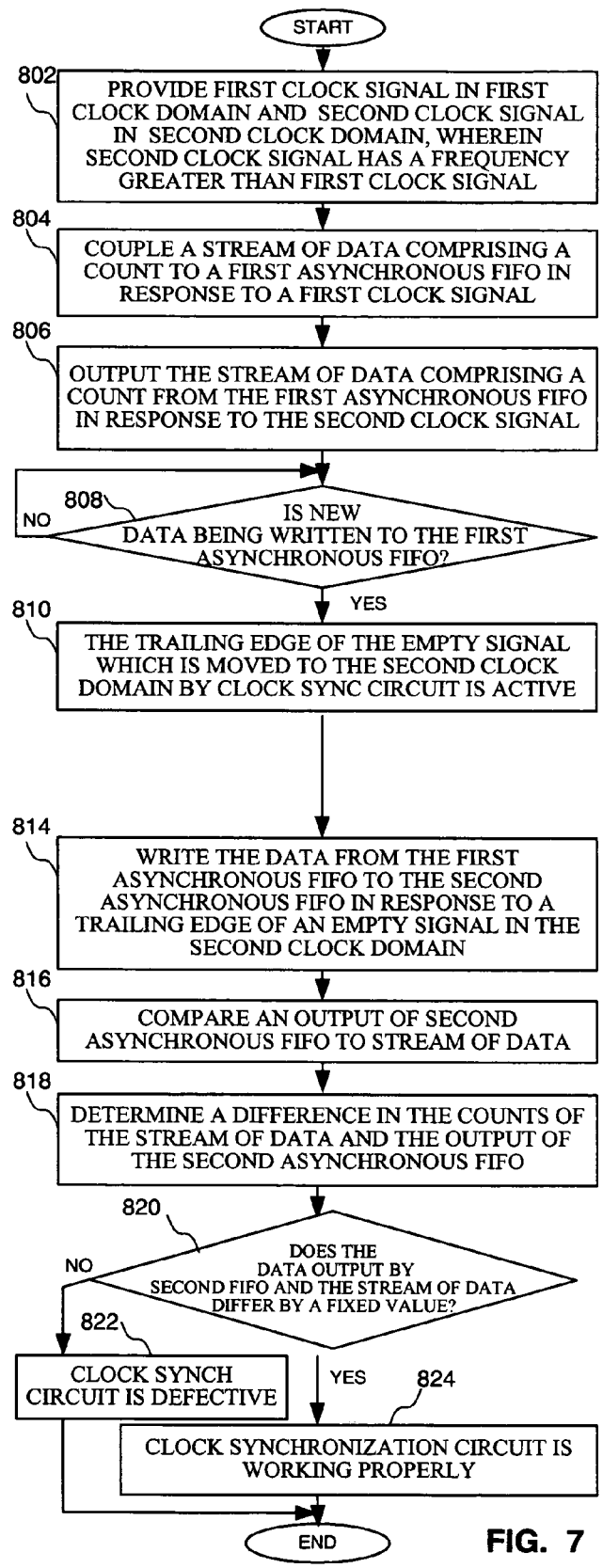
FIG. 7 is a flow chart showing a method of testing an asynchronous FIFO according to an embodiment of the present invention.

Turning now to FIG. 7, a flow chart shows a method of testing an asynchronous FIFO according to an embodiment of the present invention. A first clock signal in a first clock domain and a second clock signal in a second clock domain are provided, wherein the second clock signal has a frequency greater than the frequency of the first clock signal at a step 802. An input stream of data comprising a count is coupled to a first asynchronous FIFO in response to a first clock signal in a first clock domain at a step 804. The stream of data comprising a count from the first asynchronous FIFO is output in response to a second clock signal which has a higher frequency than the first clock signal at a step 806. It is then determined whether new data is being written to the first asynchronous FIFO at a step 808. If so, the trailing edge of the EMPTY signal, which is moved to the second clock domain by way of a clock synchronization circuit, is active at a step 810. The data from the first asynchronous FIFO is input to the second asynchronous FIFO in response to a trailing edge of an EMPTY signal in the second clock domain at a step 814. An output of the second asynchronous FIFO in response to the first clock signal is compared to the input stream of data at a step 816. A difference in the counts of the input stream of data and the output of the second asynchronous FIFO is determined at a step 818. It is then determined whether the data output by the second FIFO and the input stream of data differ by a fixed value at a step 820. If not, the clock synchronization circuit is defective at a step 822. If the data output by the second FIFO and the input stream of data differ by a fixed value, the clock synchronization circuit is working properly at a step 824.

It can therefore be appreciated that the new and novel circuit and method of testing a memory device has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A circuit for testing an asynchronous data transfer, said circuit comprising:
   a first circuit receiving a stream of data in response to a clock signal in a first clock domain, said first circuit generating an empty signal indicating that said first circuit has no data to send, wherein a rising edge of said empty signal is generated in a second clock domain and a falling edge of said empty signal is generated in said first clock domain and converted to said second clock domain;
   a second circuit coupled to said first circuit, said second circuit receiving said stream of data from said first circuit in said second clock domain in response to said falling edge of said empty signal from said first circuit; and
   a comparator circuit coupled to receive said stream of data and an output of said second circuit, wherein an output of said comparator circuit indicates whether said empty signal enables an asynchronous data transfer of said stream of data.

2. The circuit of claim 1 wherein said first circuit comprises a write circuit receiving data in said first clock domain and a read circuit generating an output in said second clock domain.

3. The circuit of claim 1 wherein said second circuit comprises a write circuit receiving data in said second clock domain and a read circuit generating the output in said first clock domain.

4. A circuit for testing an asynchronous data transfer, said circuit comprising:
   a first asynchronous FIFO receiving a stream of data in response to a first clock signal in a first clock domain, said first asynchronous FIFO outputting said stream of data in response to a second clock signal in a second clock domain, said first asynchronous FIFO generating an empty signal indicating that said first asynchronous FIFO has no data to send, wherein a rising edge of said empty signal is generated in said second clock domain and a falling edge of said empty signal is generated in said first clock domain and converted to said second clock domain;
   a second asynchronous FIFO coupled to said first asynchronous FIFO, said second asynchronous FIFO receiving data from said first asynchronous FIFO in response to a high level of an inverted empty signal in said second clock domain and outputting said data in response to said first clock signal in said first clock domain; and
   a comparator circuit coupled to receive said stream of data and said data output from said second asynchronous FIFO, wherein an output of said comparator circuit indicates whether said empty signal enables an asynchronous data transfer of said stream of data.

5. The circuit of claim 4 wherein said second asynchronous FIFO receives said data from said first asynchronous FIFO in response to said second clock signal.

6. The circuit of claim 4 wherein said first asynchronous FIFO further comprises a clock synchronization circuit.

7. The circuit of claim 6 wherein said clock synchronization circuit moves said falling edge of said empty signal from said first clock domain to said second clock domain.

8. The circuit of claim 4 further comprising a data generator outputting said stream of data in response to said first clock signal.

9. The circuit of claim 8 wherein said data generator comprises a counter.

10. The circuit of claim 4 wherein said second clock signal comprises a higher frequency clock signal than said first clock signal.

11. The circuit of claim 4 wherein said comparator circuit comprises a subtractor coupled to receive said stream of data and generate a difference.

12. The circuit of claim 11 wherein said comparator circuit further comprises a register coupled to said subtractor, said register storing said difference.

13. The circuit of claim 12 wherein said comparator circuit comprises a comparator coupled to said register and said subtractor, said comparator generating an output signal based upon a comparison of outputs of said register and said subtractor.

14. The circuit of claim 4 further comprising programmable logic couple to said comparator circuit via a programmable interconnection.

15. A circuit for testing an asynchronous data transfer, said circuit comprising:
   means for receiving an input stream of data in response to a clock signal in a first clock domain;
   means for generating an empty signal having a rising edge generated in a second clock domain and having a falling edge generated in said first clock domain and converted to said second clock domain;
   means for propagating data of said input stream of data from said means for receiving said input stream of data in response to said falling edge of said empty signal, said empty signal indicating that said means for propagating data has no data to send; and
   means for comparing said input stream of data and an output of said means for propagating data, wherein an output of said means for comparing indicates whether said empty signal enables an asynchronous data transfer of said input stream of data.

16. The circuit of claim 15 further comprising means for generating said input data stream.

17. A method of testing an asynchronous data transfer, said method comprising the steps of:
   coupling a stream of data to a first circuit in response to a first clock signal in a first clock domain;

outputting said stream of data from said first circuit in response to a second clock signal in a second clock domain;

writing data from said first circuit to said second circuit in response to a low level of an empty signal, said empty signal indicating that said first circuit has no data from said stream of data to send, wherein a rising edge of said empty signal is generated in said second clock domain and a falling edge of said empty signal is generated in said first clock domain and converted to said second clock domain;

comparing data output by said second circuit to said stream of data; and determining whether said empty signal enables said asynchronous data transfer of said stream of data.

18. The method of claim 17 wherein said step of coupling a stream of data to a first circuit comprises a step of coupling a count which is clocked by said first clock signal.

19. The method of claim 17 wherein said step of outputting said stream of data comprises a step of outputting said stream of data in response to a second clock signal which has a higher frequency than said first clock signal.

20. The method of claim 17 further comprising a step of outputting data from said second circuit in response to said first clock signal.

21. The method of claim 17 wherein said step of determining comprises determining if said data output by said step of comparing and said stream of data differ by a fixed value.

22. The method of claim 17 wherein said first circuit comprises a first FIFO embedded in a programmable logic device (PLD) and said second circuit comprises a second FIFO embedded in said PLD.

* * * * *